(12) United States Patent
Ishikawa et al.

(10) Patent No.: US 7,595,219 B2
(45) Date of Patent: Sep. 29, 2009

(54) IC CHIP MOUNTING METHOD FOR MOUNTING TWO OR MORE IC CHIPS BY SEQUENTIALLY TRANSFERRING THE IC CHIPS SUCKED ONTO A FIRST ROLLER TO A SECOND ROLLER AND MOUNTING THE IC CHIPS TRANSFERRED TO THE SECOND ROLLER ON A TRAVELING BASE

(75) Inventors: Naoki Ishikawa, Kawasaki (JP); Tatsuro Tsuneno, Inagi (JP); Hidehiko Kira, Kawasaki (JP); Hiroshi Kobayashi, Kawasaki (JP)

(73) Assignees: Fujitsu Limited, Kawasaki (JP); Fujitsu Frontech Limited, Tokyo (JP)

( * ) Notice: Subject to any disclaimer, the term of this patent is extended or adjusted under 35 U.S.C. 154(b) by 0 days.

(21) Appl. No.: 11/324,600

(22) Filed: Jan. 4, 2006

(65) Prior Publication Data
US 2007/0020801 A1 Jan. 25, 2007

(30) Foreign Application Priority Data
Jul. 20, 2005 (JP) ............................. 2005-209971

(51) Int. Cl.
*H01L 21/00* (2006.01)
(52) U.S. Cl. ................................ 438/106; 257/E21.499
(58) Field of Classification Search .................. 438/15, 438/110, 106, 113, 114, 118, 460, 464, 976, 438/51, 55, 64; 156/289, 230; 29/426.6, 29/426.3; 257/E27.161, E21.499, E21.51
See application file for complete search history.

(56) References Cited
U.S. PATENT DOCUMENTS
5,988,794 A * 11/1999 Takagi ......................... 347/55

6,126,275 A * 10/2000 Kagayama .................... 347/55
6,176,966 B1   1/2001 Tsujimoto et al. ........... 156/344
6,332,268 B1 * 12/2001 Imanishi et al. ............... 29/832

(Continued)

FOREIGN PATENT DOCUMENTS

CN         1206329 A       1/1999

(Continued)

OTHER PUBLICATIONS

European Search Report dated Dec. 7, 2006.

(Continued)

*Primary Examiner*—Thao P. Le
(74) *Attorney, Agent, or Firm*—Kratz, Quintos & Hanson, LLP

(57) ABSTRACT

The present invention provides an IC chip mounting method for mounting two or more IC chips on a base, including: preparing a wafer by mounting a tape on a face thereof, which is the reverse of the wafer having a mounting surface to be attached to the base, and by dividing the wafer into IC chips by dicing while leaving the tape; sequentially pressing the IC chips on the wafer against a first roller to allow the chips to be sucked onto the first roller; subsequently transferring the IC chips sucked onto the first roller to a second roller; and subsequently mounting the IC chips transferred to the second roller on the traveling base.

2 Claims, 3 Drawing Sheets

U.S. PATENT DOCUMENTS

| | | | |
|---|---|---|---|
| 2005/0166391 A1* | 8/2005 | Berndtsson | 29/600 |
| 2006/0128057 A1* | 6/2006 | Lu et al. | 438/106 |
| 2006/0238345 A1* | 10/2006 | Ferguson et al. | 340/572.1 |
| 2008/0283194 A1* | 11/2008 | Mitsui et al. | 156/540 |
| 2008/0310938 A1* | 12/2008 | Inoue et al. | 414/151 |

FOREIGN PATENT DOCUMENTS

| | | | |
|---|---|---|---|
| JP | 11-292047 | | 10/1999 |
| JP | 03-016405 | * | 1/2003 |
| JP | 2003-016405 | | 1/2003 |
| JP | 2003-242472 | | 8/2003 |
| WO | WO 02/091812 A1 | | 11/2002 |

OTHER PUBLICATIONS

Chinese Office Action and English translation dated Nov. 30, 2007.

* cited by examiner

IC CHIP MOUNTING METHOD FOR MOUNTING TWO OR MORE IC CHIPS BY SEQUENTIALLY TRANSFERRING THE IC CHIPS SUCKED ONTO A FIRST ROLLER TO A SECOND ROLLER AND MOUNTING THE IC CHIPS TRANSFERRED TO THE SECOND ROLLER ON A TRAVELING BASE

BACKGROUND OF THE INVENTION

1. Field of the Invention

The present invention relates to an IC chip mounting method for mounting two or more IC chips on a base.

2. Description of the Related Art

In recent years, various types of RFID tags have been proposed which exchange information with an external apparatus typified by a reader writer in a noncontact manner through electric waves. As one type of the RFID tags, there has been proposed a structure in which antenna patterns for radio communication and IC chips are mounted on a base sheet formed out of plastic or paper. For this type of RFID tags, there have been created usage patterns such as article identification by attaching the tag onto an article or the like and exchanging information about the article with the external apparatus.

FIG. 1 is an elevational view (A) and a sectional side elevation view (B) illustrating an example of a RFID tag.

RFID tag 1 illustrated in FIG. 1 is constituted of an antenna 12 fitted onto a base 13 formed out of a sheet-like PET film or the like, an IC chip 11 connected to the antenna 12 through a bump 16 and a cover sheet 14 bonded to the base 13 using adhesives 15 with the antenna 12 and an IC chip 11 covered.

An IC chip 11 constituting the RFID tag can make radio communications with an external apparatus through the antenna 12 for information exchange.

For the RFID tag, a wide range of usage patterns including the usage pattern described above have been created, however, use of the RFID tags in various types of usage patterns has a severe problem on manufacturing cost thereof, accordingly various efforts have been made for reduction in the manufacturing cost.

FIG. 2 is a view illustrating a general IC chip mounting method, one of conventional methods for RFID tags.

As illustrated in part (A) of FIG. 2, the whole surface of a back side (a face on the opposite side to a mounting surface to a base sheet) of a wafer 10 built out of various types of IC chips is mounted with a tape 30 and divided into IC chips 11, leaving the tape 30 by dicing.

As illustrated in part (B) of FIG. 2, one of a large amount of the IC chips 11 on the wafer 20 is pulled up from the tape 30 using a push-up jig 31 and taken off from the tape 30 and held up using a picking jig 32.

As illustrated in part (C) of FIG. 2, the picking jig 32 with the IC chip 11 sucked is turned upside down.

As illustrated in part (D) of FIG. 2, the IC chip 11 is transferred onto a bonding head 33.

Furthermore, as illustrated in part (E) of FIG. 2, the bonding head 33 carries the IC chip 11 onto the base 13, places the chip on a proper position connected to the antenna 12 formed on the base 13 and mounts the IC chip 11 on the base 13 by means of a soldering process including pressurzing and heating.

Respective processes illustrated in FIGS. 2(B) to 2(E) are sequentially repeated for a large amount of IC chips 11 on the wafer 10.

However, this mounting method requires to sequentially perform, for each IC chip, a complicated process that the IC chips 11 on the wafer 10 are picked up one by one, inverted, delivered to another jig (bonding head) and mounted at the bonding head, thus impairing productivity and increasing manufacturing cost.

As one method for reducing the manufacturing cost, Japanese Patent Laid-Open No. 2003-242472 has proposed that recessed portions for embedding IC chips are formed at intervals on a traveling web material (base), the IC chips are fitted into the recessed portions and antenna patterns are printed by means of an ink jet method so as to be connected with the IC chips fitted into the recessed portions.

However, the method proposed by Japanese Patent Laid-Open No. 2003-242472 includes filling a tank with liquid to float the IC chips in the liquid and traveling the web material (base) through the tank inside to fit the IC chips into the recessed portions on the web material (base) in mounting the IC chips into the recessed portions on the web material (base). The conventional method has a problem of low process reliability of fitting the IC chips into the recessed portions because the IC chips are not always fitted exactly into the recessed portions in a proper direction and the recesses having no IC chips in it may pass through the tank inside. Even if the IC chips are properly fitted into the recessed portion, the antenna pattern needs to be positioned with high accuracy relative to the IC chips fitted into the recessed portions. Moreover, if a negligible error occurs at a position where the IC chips are fitted into the recessed portions, a printing position of the antenna pattern needs to be changed according to the error, which may not yield high productivity.

SUMMARY OF THE INVENTION

The present invention has been made in view of the above circumstances and provides an IC chip mounting method for improving productivity for mounting two or more IC chips on a base, including the steps of:

preparing a wafer by mounting a tape on a face thereof, which is the reverse of the wafer having a mounting surface to be attached to the base, and by dividing the wafer into IC chips by dicing while leaving the tape;

sequentially pressing the IC chips on the wafer against a first roller to allow the chips to be sucked onto the first roller;

subsequently transferring the IC chips sucked onto the first roller to a second roller; and subsequently mounting the IC chips transferred to the second roller on the traveling base.

The present invention allows the IC chips to be sucked onto the first roller, transfers the chips onto the second roller, and mounts the chips on the base as they are with the second roller, thus sequentially and continuously mounting the two or more IC chips for high productivity.

In the IC chip mounting method of the present invention, preferably includes the steps of:

rotating the second roller at the same surface speed as a traveling speed of the base; and transferring the IC chips sucked onto the first roller to the second roller so that the IC chips may be arranged at the same intervals as intervals between mounting positions of the IC chips on the base adjacent to each other.

A surface speed of the second roller and a traveling speed of the base are met each other to ensure that the intervals between the IC chips on the second roller are the same as the intervals between mounting positions of the IC chips on the base, thus mounting the IC chips positioned on the second roller onto the base with high positioning accuracy.

An IC chip mounting method of the present invention may further include the steps of:

preparing a base formed with two or more antennas for radio communication provided at prescribed intervals; and sequentially mounting the IC chips each having mounted thereon a circuit, which performs radio communication respectively through the antennas, at respective positions connected to the antennas on the base.

In other words, application of the present invention to the mounting method of IC chips for RFID tags is one of preferable forms.

The present invention provides sequential and continuous mounting of two or more IC chips on a base, thus attaining high productivity.

DETAILED DESCRIPTION OF THE INVENTION

An embodiment of the present invention will be described below.

Figure 3:
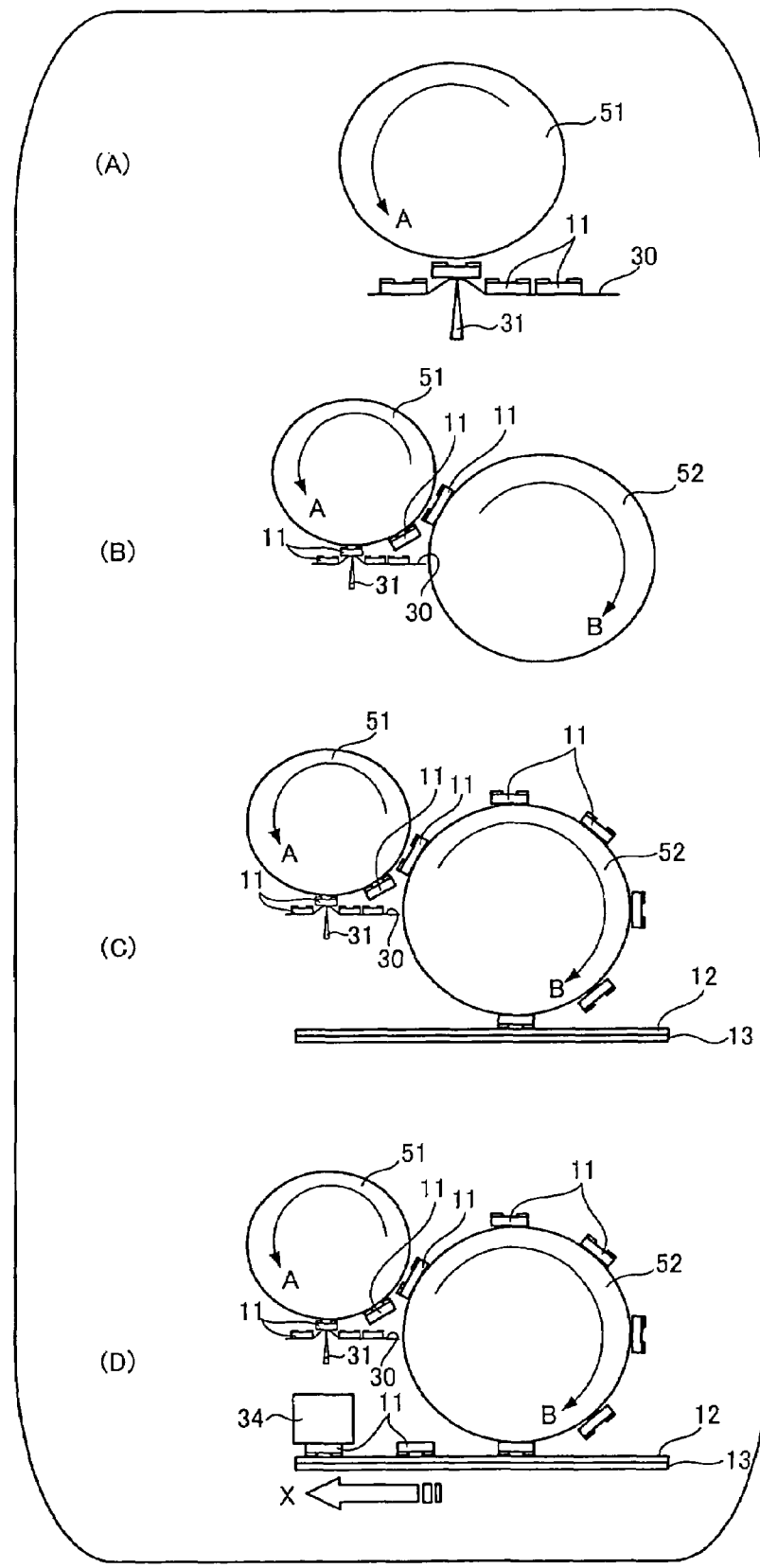
FIG. 3 is a process view illustrating one embodiment of the present invention.

FIG. 3 is a process view illustrating an embodiment of the present invention.

Figure 1:
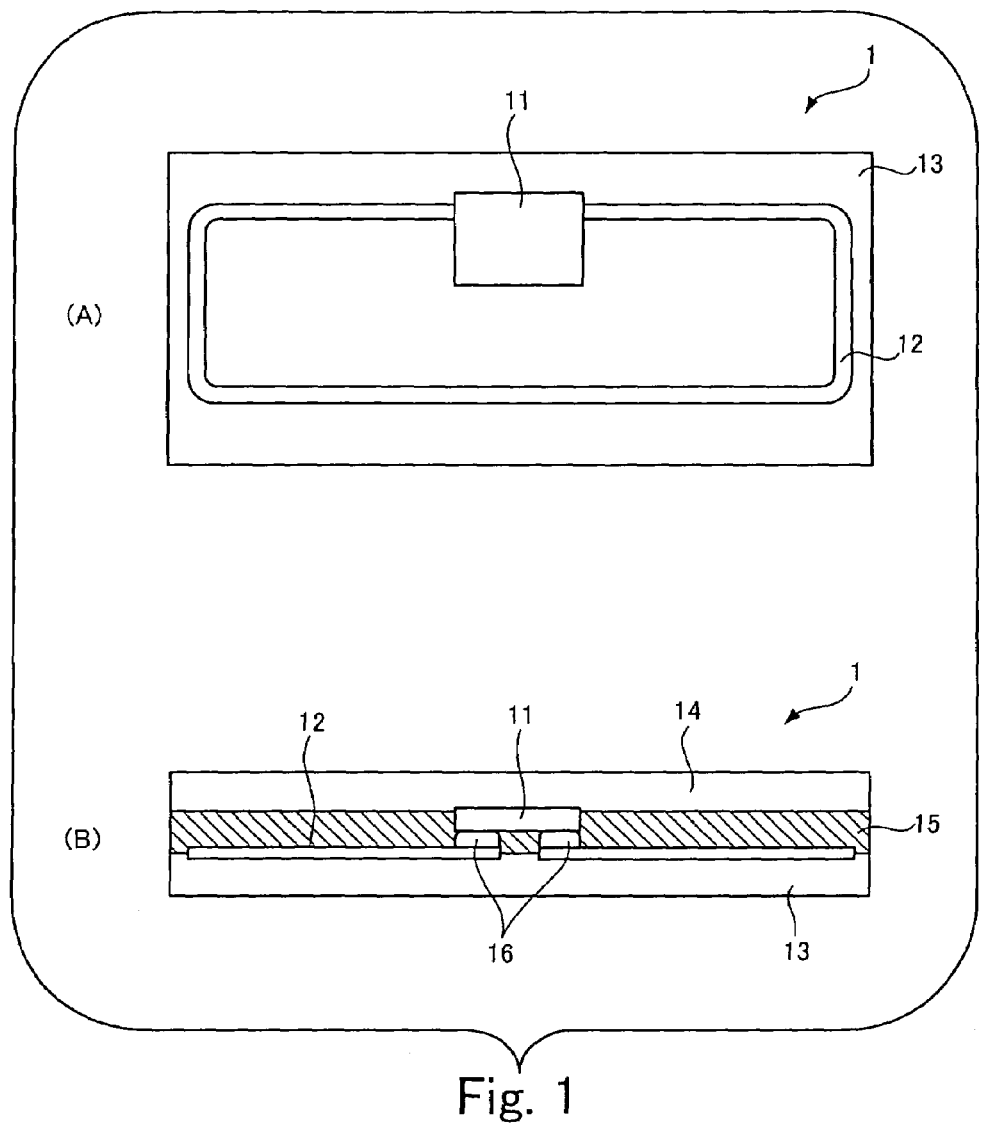
FIG. 1 is an elevational view (A) and a sectional side elevation view (B) illustrating an example of a RFID tag.
Figure 2:
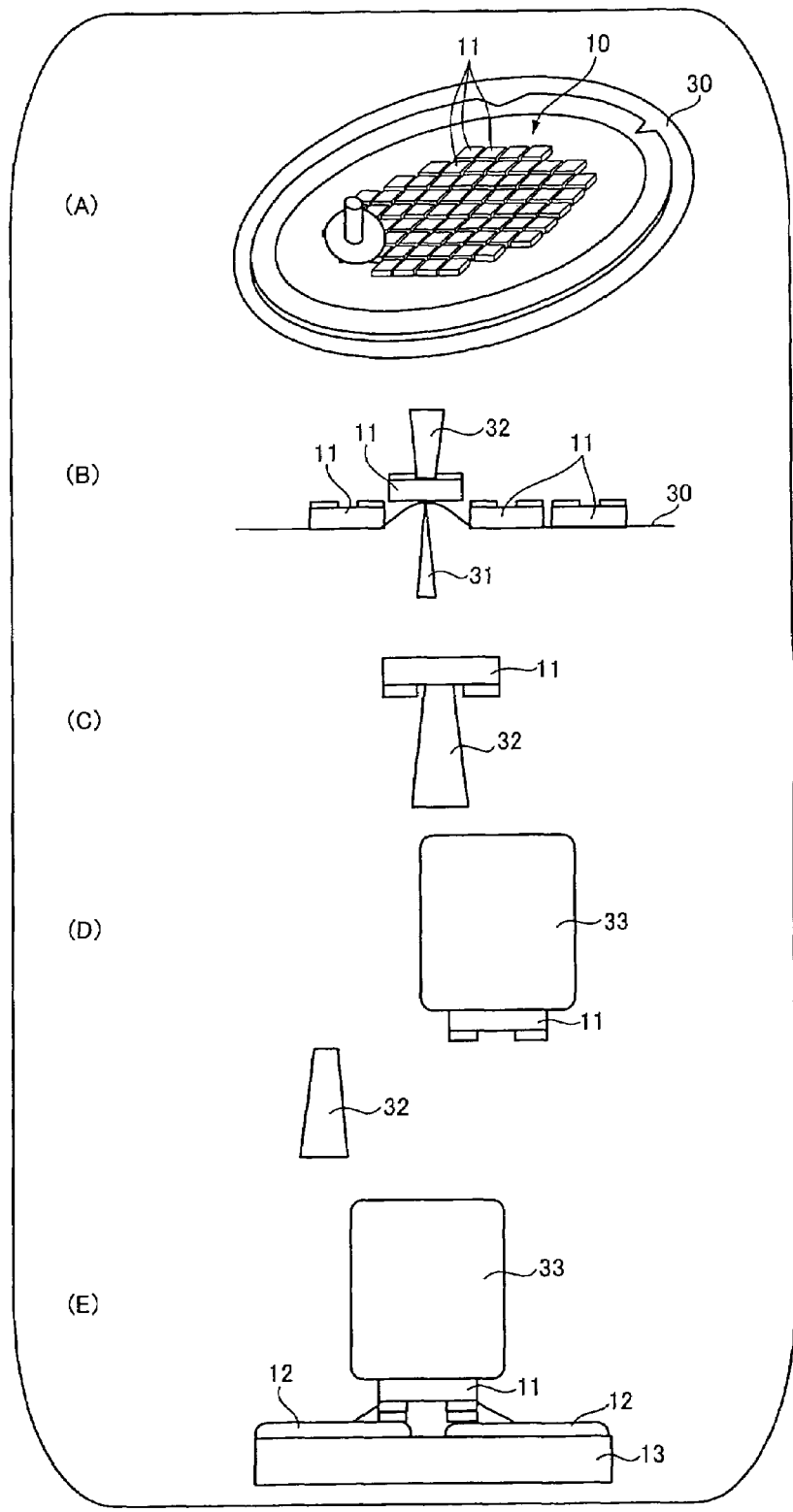
FIG. 2 is a view illustrating a general IC chip mounting method, one of conventional manufacturing methods for RFID tags.

As described in part (A) of FIG. 2, first, there is a wafer 10 of which face is on the opposite side to the mounting surface to the base is mounted with a tape 30 and which is divided into IC chips, leaving the tape 30 by dicing (refer to part (A) of FIG. 2).

As illustrated in part (A) of FIG. 3, next, the IC chips 11 on the wafer 10 are respectively pressed up by a push-up jig 31 and are sequentially sucked onto a first roller 51 rotating one by one in a direction of an arrow A. The first roller 51 may be structured so as to continuously rotate in the direction of the arrow A or so as to stop the rotation thereof for intermittent rotation at the time of sucking the IC chip, in order to permit the IC chip to be sucked onto the first roller 51 with high positioning accuracy. This respect is the same as for a second roller 52 described below.

Each of the IC chips 11 sucked onto and placed on the first roller 51, as illustrated in part (B) of FIG. 3, is transferred onto the second roller 52 rotating in a direction of an arrow B and sucked onto the second roller 52.

The IC chips 11 are transferred and sucked onto the second roller 52 from the first roller 51 one after another and are mounted at respective positions aligning with the two or more antennas 12 arranged side by side on the base 13 (part (C) of FIG. 3). The base 13 travels in a direction of an arrow X as illustrated in part (D) of FIG. 3 and the IC chips 11 on the second roller 52 are sequentially mounted at the respective positions aligning with the respective antennas 12 on the base 13.

The IC chips 11 mounted on the base 13 are then soldered onto the antennas 12 respectively with a heating and pressurizing jig 34.

A rotational speed of the second roller 52 is set so that a surface speed of the second roller 52 may be the same as a traveling speed of the base 13 moving in the direction of the arrow X. To make intervals between the IC chips 11 on the second roller 52 equal to repetition intervals between patterns of the antennas 12 on the base, that is, intervals between mounting positions of the IC chips 11 on the base, the rotational speed of the first roller 51, press-up time intervals of the IC chips 11 on the first roller 51 by a push-up jig 31, and the like are adjusted.

In this embodiment, the first roller 51 and the second roller 52 are intermittently rotated and the base 13 also runs intermittently. Otherwise, this embodiment may be structured so that they may continuously rotate or run, provided that the final positioning accuracy for mounting of the IC chips 11 on the base 13 is ensured.

Moreover, the heating and pressurizing jig 34 may be so structured as to heat and pressurize the IC chips 11 during stopping of the base 13 when the base 13 is intermittently fed, or to heat and pressurize the IC chips 11 while the jig is moving simultaneously with running of the base 13.

Accordingly, this embodiment provides continuous transfer and mounting of a great many IC chips 11, thereby attaining high productivity of IC chip mounting.

What is claimed is:

1. An IC chip mounting method for mounting two or more IC chips on a base, comprising the steps of:

preparing a wafer by mounting a tape on a face thereof, which is the reverse of the wafer having a mounting surface to be attached to the base, and by dividing the wafer into IC chips by dicing while leaving the tape;

sequentially pressing the mounting surface to be attached to the base of the IC chips on the wafer against a first roller to allow the chips to be sucked onto the first roller;

subsequently transferring the IC chips sucked onto the first roller to a surface of the second roller rotating at the same surface speed as a traveling speed of the based so that the IC chips may be arranged at the same intervals as intervals between mounting positions of the IC chips on the base adjacent to each other, and the reverse of the mounting surface to be attached to the base of the IC chips is on the second roller; and subsequently mounting the IC chips transferred to the second roller on the traveling base, the second roller transferring the IC chips such that the IC chips are sucked onto the surface of the second roller during one cycle of rotation of the second roller, and only a single IC chip contacting the base in an area in which the second roller and the base are closest to each other, wherein the diameter of the second roller is larger than that of the first roller.

2. An IC chip mounting method according to claim 1, further comprising the steps of:

preparing a base formed with two or more antennas for radio communication provided at prescribed intervals; and sequentially mounting the IC chips each having mounted thereon a circuit, which performs radio communication respectively through the antennas, at respective positions connected to the antennas on the base.

* * * * *